United States Patent
Poremba

(10) Patent No.: US 12,254,195 B2
(45) Date of Patent: Mar. 18, 2025

(54) SPARSE MATRIX OPERATIONS USING PROCESSING-IN-MEMORY

(71) Applicant: Advanced Micro Devices, Inc., Santa Clara, CA (US)

(72) Inventor: Matthew R Poremba, Seattle, WA (US)

(73) Assignee: Advanced Micro Devices, Inc., Santa Clara, CA (US)

(*) Notice: Subject to any disclaimer, the term of this patent is extended or adjusted under 35 U.S.C. 154(b) by 210 days.

(21) Appl. No.: 17/978,617

(22) Filed: Nov. 1, 2022

(65) Prior Publication Data
US 2024/0143199 A1    May 2, 2024

(51) Int. Cl.
*G06F 3/06* (2006.01)

(52) U.S. Cl.
CPC .......... *G06F 3/0625* (2013.01); *G06F 3/0629* (2013.01); *G06F 3/0673* (2013.01)

(58) Field of Classification Search
CPC .... G06F 3/0625; G06F 3/0629; G06F 3/0673; G06F 2212/454; G06F 12/0207; G06F 17/16; G06F 9/30014; G06F 9/30036; G06F 9/35; G06F 9/355; G11C 7/1006
See application file for complete search history.

(56) References Cited

U.S. PATENT DOCUMENTS

| | | | |
|---|---|---|---|
| 2009/0216964 A1* | 8/2009 | Palladino | G06F 13/28 711/E12.001 |
| 2010/0169403 A1* | 7/2010 | DeLaquil | G06F 17/12 708/446 |
| 2016/0179750 A1* | 6/2016 | Zhou | G06F 17/16 708/203 |
| 2016/0224465 A1* | 8/2016 | Morad | G06F 9/3887 |
| 2020/0026513 A1* | 1/2020 | Akin | G06F 9/3004 |
| 2020/0110705 A1* | 4/2020 | Jo | G06F 12/0877 |
| 2021/0240443 A1* | 8/2021 | Chang | G11C 13/004 |
| 2021/0286718 A1* | 9/2021 | Ravindar | G06F 8/443 |
| 2022/0114270 A1* | 4/2022 | Wang | G06F 15/7807 |
| 2023/0024035 A1* | 1/2023 | Thuerck | G06F 15/8046 |

OTHER PUBLICATIONS

Poremba, Matthew R, et al., "US Application as Filed", U.S. Appl. No. 17/561,406, filed Dec. 23, 2021, 25 pages.

* cited by examiner

*Primary Examiner* — Farley Abad
(74) *Attorney, Agent, or Firm* — FIG. 1 Patents

(57) ABSTRACT

Sparse matrix operations using processing-in-memory is described. In accordance with the described techniques, a processing-in-memory component of a memory module receives a request for a vector element stored at a first location in memory of the memory module. The processing-in-memory component identifies an index value for a non-zero element in a sparse matrix using a representation of the sparse matrix stored at a second location in the memory. The processing-in-memory component then outputs a result that includes the vector element by retrieving the vector element from the first location in memory using the index value.

20 Claims, 6 Drawing Sheets

SPARSE MATRIX OPERATIONS USING PROCESSING-IN-MEMORY

BACKGROUND

Processing-in-memory (PIM) architectures move processing of memory-intensive computations to memory. This contrasts with standard computer architectures which communicate data back and forth between a memory and a remote processing unit. In terms of data communication pathways, remote processing units of conventional computer architectures are further away from memory than processing-in-memory components. As a result, these conventional computer architectures suffer from increased data transfer latency, which can decrease overall computer performance. Further, due to the proximity to memory, PIM architectures provide higher memory bandwidth and reduced memory access energy relative to conventional computer architectures particularly when the volume of data transferred between the memory and the remote processing unit is large. Thus, processing-in-memory architectures enable increased computer performance while reducing data transfer latency as compared to conventional computer architectures that implement remote processing hardware.

DETAILED DESCRIPTION

Overview

Figure 1:
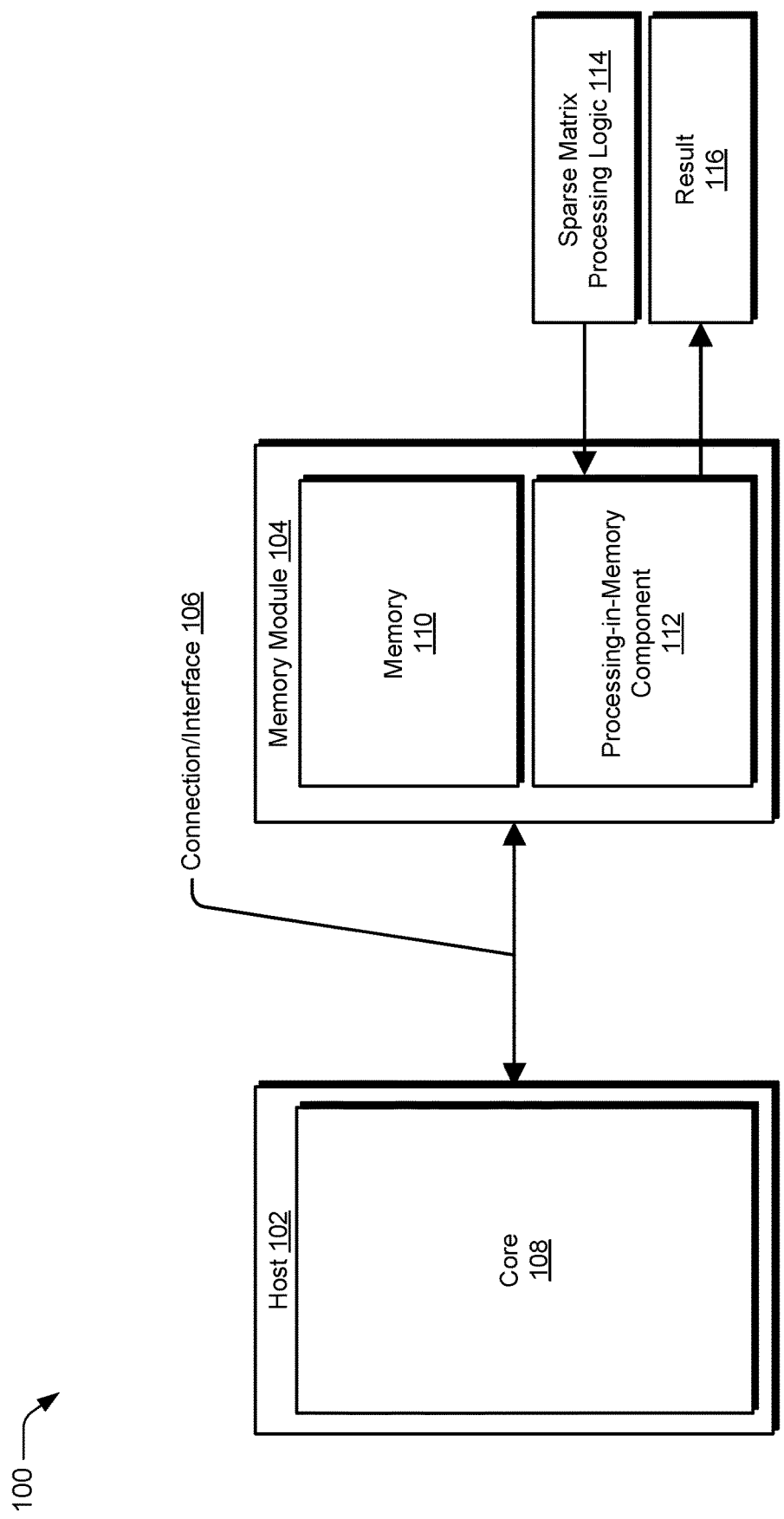
FIG. 1 is a block diagram of a non-limiting example system having a host with a core and a memory module with a memory and a processing-in-memory component.

Computing devices implement algorithms that include matrix operations, such as matrix multiplication, for a wide range of applications, such as graph algorithms, conjugate gradient solvers, sparse linear algebra, and so forth. Algorithms designed for performing operations using dense matrix structures, however, are slow and inefficient when applied to sparse matrices, as computational resources and processing time are wasted on handling zeroes in sparse matrices. This waste of computational resources and processing time is compounded when dense matrix operations are applied to large sparse matrices.

In some implementations, conventional dense-matrix algorithms cause timeouts when extended to very large sparse matrices and fail to function as intended. In terms of computational memory requirements, sparse data is more easily compressed and thus requires significantly less storage relative to dense data of a similar size. For instance, in the case of a sparse matrix, substantial memory requirement reductions are realized by storing only non-zero entries in memory. Depending on the number and distribution of non-zero entries in a sparse matrix, different data structures are implementable to achieve significant memory savings when compared to storing the sparse matrix with its zeroes.

While storing only the non-zero entries of sparse matrices is beneficial from a reduced memory requirement standpoint, the trade-off is that accessing individual matrix elements from memory becomes more complex and requires certain structures in memory to unambiguously access these elements. Conventional formats that have been developed to represent sparse matrices using such structures include Compressed Sparse Row (CSR) and Compressed Sparse Column (CSC). Computing applications frequently leverage sparse matrices to compute sparse matrix-vector products, often requiring computation of a sparse matrix-vector product (SpMV) multiple times over the course of executing an algorithm.

In many instances, such as when implementing iterative solvers, a majority of time spent by a host processing device when executing an algorithm is spent performing matrix-vector product evaluations. When performing SpMV using sparse matrices, conventional systems require a host processing device to repeatedly retrieve matrix and vector elements from memory before using those matrix and vector elements to compute a product. This creates a significant amount of traffic on a communication pathway connecting the host processor with the memory, and the host processor is unable to perform such operations until the vector and matrix elements are retrieved from memory. When performing SpMV using a compressed representation of a sparse matrix (e.g., CSR or CSC), this communication burden is compounded due to the irregular storage of sparse matrix elements in memory.

To address these conventional problems, performing sparse matrix operations using processing-in-memory is described. In implementations, a system includes a memory module having a memory and a processing-in-memory component. The memory module is communicatively coupled to a core of a host, such as a core of a host processor. Using the techniques described herein, the processing-in-memory component is configured to access a vector stored in virtual memory of the memory module. The processing-in-memory component is further configured to access a representation of a sparse matrix stored in physical memory of the memory module. Using the representation of the sparse matrix, the processing-in-memory component is configured to identify an index value that describes, for a non-zero element of the sparse matrix, a location of the sparse matrix in which the non-zero element is disposed.

For instance, in an example implementation where the sparse matrix is represented using CSR, the index value specifies a column of the sparse matrix in which the non-zero element is disposed. As another example, in an implementation where the sparse matrix is represented using CSC, the index value specifies a row of the sparse matrix in which the non-zero element is disposed. The processing-in-memory component is further configured to identify an element in the vector stored in virtual memory based on the index value for the non-zero element of the sparse matrix.

In some implementations, the processing-in-memory component identifies the vector element by computing an offset virtual address that increments a base virtual address for the vector using an offset integer value defined by the index value. The processing-in-memory component is further configured to compute a result vector element using the vector element and the non-zero element of the sparse matrix (e.g., multiply the vector element by the non-zero element and output the resulting product as the result vector element). In some implementations, the processing-in-memory component is configured to repeat these operations for multiple non-zero elements of the sparse matrix.

For instance, in an example scenario the processing-in-memory component identifies, for each non-zero element in a row of the sparse matrix represented in memory using CSR, a column index value and an element of the vector stored in virtual memory for the non-zero element. Continuing this example scenario, the processing-in-memory component computes a result vector element for each non-zero element in the row of the sparse matrix (e.g., by multiplying each non-zero element by a corresponding element in the vector identified by the column index value for the non-zero element).

In some implementations, the processing-in-memory component is configured to perform sparse matrix operations using data stored in different memory locations based on sparse matrix processing logic. In some implementations, the sparse matrix processing logic is received in a command or an instruction from a host processor communicatively coupled to a memory module implementing the processing-in-memory component. Alternatively, or additionally, the processing-in-memory component is configured to perform sparse matrix operations based on sparse matrix processing logic stored in the memory module. Alternatively or additionally, the processing-in-memory component is configured to perform sparse matrix operations based on sparse matrix processing logic stored in the processing-in-memory component (e.g., sparse matrix processing logic maintained in one or more registers of the processing-in-memory component).

Although described with respect to functionality implemented by a single processing-in-memory component, in some implementations the techniques described herein are implemented by multiple processing-in-memory components in parallel (e.g., simultaneously, or near-simultaneously with one another). As an example, when memory is configured as dynamic random-access memory (DRAM), a processing-in-memory component is included at each hierarchical DRAM component (e.g., channel, bank, array, and so forth). For instance, consider an example implementation where a command or instruction from a host processor includes a request to compute a result vector element for each of a plurality of non-zero elements in a sparse matrix. In this example implementation, the command or instruction is provided to a plurality of processing-in-memory components, which are each tasked with handing one or more of the plurality of non-zero elements. For instance, in this example implementation each processing-in-memory component is tasked with processing a different row of the sparse matrix.

In another example implementation, an individual processing-in-memory component is tasked with processing an individual non-zero element in the sparse matrix. In implementations where spars matrix operations are performed by a plurality of processing-in-memory components in parallel with one another, the vector stored in virtual memory is duplicated such that each processing-in-memory component is provided with a copy of the vector. As a specific example, the vector is duplicated such that one copy resides in each of a plurality of memory channels that are each associated with a processing-in-memory component, where each vector copy is assigned a base virtual address on a per-channel basis. Thus, rather than requiring multiple commands, one for each memory component to perform sparse matrix operations, the described techniques enable a single command to cause each processing-in-memory component to perform discrete sparse matrix operations.

By performing sparse matrix operations using a processing-in-memory component, the described techniques do not cause additional traffic on the interface between a host processor and a memory module implementing the processing-in-memory component. This is not possible using conventional systems, which utilize the core of the remote host processor to perform operations involving data stored in memory. The described techniques further advantageously save cycles of the remote host processor, which reduces system power consumption and frees the host processor to perform additional operations relative to conventional systems.

In some aspects, the techniques described herein relate to a system including: a memory of a memory module and a processing-in-memory component of the memory module configured to receive a request for at least one element of a vector stored at a first location in the memory, identify, from a representation of a sparse matrix stored at a second location in the memory, at least one index value for at least one non-zero element in a row of the sparse matrix, and output a result that includes the at least one element of the vector by retrieving the at least one element of the vector from the first location in the memory using the at least one index value.

In some aspects, the techniques described herein relate to a system, wherein the first location in the memory corresponds to a virtual memory location identified by a base virtual address.

In some aspects, the techniques described herein relate to a system, wherein the processing-in-memory component is configured to retrieve the at least one element of the vector from the first location in the memory by computing, for an index value of the identified at least one index value, an offset virtual address by incrementing the base virtual address using the index value and accessing data stored at the offset virtual address.

In some aspects, the techniques described herein relate to a system, wherein the processing-in-memory component is further configured to access the representation of the sparse matrix from the second location in the memory and store the representation of the sparse matrix in a register of the processing-in-memory component in response to receiving the request.

In some aspects, the techniques described herein relate to a system, wherein the processing-in-memory component is configured to output the result by overwriting the representation of the sparse matrix in the register of the processing-in-memory component with the at least one element of the vector.

In some aspects, the techniques described herein relate to a system, wherein the processing-in-memory component is further configured to compute a result vector element using the at least one element of the vector and the at least one non-zero element in the row of the sparse matrix.

In some aspects, the techniques described herein relate to a system, wherein the processing-in-memory component is configured to receive the request for the at least one element of the vector from a host that includes a core.

In some aspects, the techniques described herein relate to a system, wherein the processing-in-memory component is configured to output the result to the host.

In some aspects, the techniques described herein relate to a system, the memory module further including a plurality of processing-in-memory components, wherein the memory module is configured to load sparse matrix processing logic into each of the plurality of processing-in-memory components and task each of the plurality of processing-in-memory components with identifying, for a different row of the sparse matrix, one or more index values for one or more non-zero elements in the different row of the sparse matrix.

In some aspects, the techniques described herein relate to a system, wherein the processing-in-memory component is configured to output the result by writing the result to a memory location that is communicatively coupled to a host that includes a core.

In some aspects, the techniques described herein relate to a system, wherein the core is a central processing unit or a graphics processing unit.

In some aspects, the techniques described herein relate to a system, wherein the processing-in-memory component is configured to identify the at least one index value and output the result by executing sparse matrix processing logic that is received from a host that includes a core.

In some aspects, the techniques described herein relate to a system, wherein the request is received from a host that includes a core and the processing-in-memory component is configured to identify the at least one index value and output the result without traffic on a connection between the host and the memory.

In some aspects, the techniques described herein relate to a system, wherein the at least one element of the vector is a floating-point number stored at the first location in the memory and wherein the processing-in-memory component is further configured to identify a single precision bit in the floating-point number by removing a plurality of bits from the floating-point number, wherein the result is computed using the single precision bit and the at least one non-zero element in the row of the sparse matrix.

In some aspects, the techniques described herein relate to a method including accessing, by a processing-in-memory component, a dense vector stored in virtual memory, accessing, by the processing-in-memory component, a representation of a sparse matrix stored in physical memory and identifying an index value for a non-zero value in the sparse matrix using the representation of the sparse matrix, identifying, by the processing-in-memory component, an element in the dense vector using the index value, and computing a result vector element using the element in the dense vector and the non-zero value in the sparse matrix.

In some aspects, the techniques described herein relate to a method, wherein identifying the element in the dense vector using the index value includes computing an offset virtual address by incrementing a base virtual address for the dense vector using an offset identified by the index value.

In some aspects, the techniques described herein relate to a method, further including storing, by the processing-in-memory component, the representation of the sparse matrix in at least one register of the processing-in-memory component in response to accessing the representation of the sparse matrix and outputting, by the processing-in-memory component, the result vector element by overwriting the representation of the sparse matrix in the at least one register of the processing-in-memory component.

In some aspects, the techniques described herein relate to a method, further including outputting, by the processing-in-memory component, the result vector element to a host that includes a core, wherein the host is communicatively coupled to a memory module implementing the processing-in-memory component.

In some aspects, the techniques described herein relate to a method, wherein accessing the dense vector, accessing the representation of the sparse matrix, identifying the element in the dense vector, and computing the result vector element are performed by the processing-in-memory component independent of traffic on a connection between a memory module implementing the processing-in-memory component and a host that includes a core.

In some aspects, the techniques described herein relate to a method including receiving, by a processing-in-memory component of a memory module, a request for at least one element of a vector stored at a first location in a memory of the memory module, identifying, by the processing-in-memory component and from a representation of a sparse matrix stored at a second location in the memory, at least one column index value for at least one non-zero element in a row of the sparse matrix, and outputting, by the processing-in-memory component, a result that includes the at least one element of the vector by retrieving the at least one element of the vector from the first location in the memory using the at least one column index value.

FIG. 1 is a block diagram of a system 100 that includes a host with a core and further includes a memory module with a memory and a processing-in-memory component. In particular, the system 100 includes host 102 and memory module 104, where the host 102 and the memory module 104 are communicatively coupled via connection/interface 106. In one or more implementations, the host 102 includes core 108, and the memory module 104 includes memory 110 and processing-in-memory component 112.

In accordance with the described techniques, the host 102 and the memory module 104 are coupled to one another via a wired or wireless connection, which is depicted in the illustrated example of FIG. 1 as the connection/interface 106. Example wired connections include, but are not limited to, buses (e.g., a data bus), interconnects, traces, and planes. Examples of devices in which the system 100 is implemented include, but are not limited to, supercomputers and/or computer clusters of high-performance computing (HPC) environments, servers, personal computers, laptops, desktops, game consoles, set top boxes, tablets, smartphones, mobile devices, virtual and/or augmented reality devices, wearables, medical devices, systems on chips, and other computing devices or systems.

The host 102 is an electronic circuit that performs various operations on and/or using data in the memory 110. Examples of the host 102 and/or the core 108 include, but are not limited to, a central processing unit (CPU), a graphics processing unit (GPU), a field programmable gate array (FPGA), an accelerated processing unit (APU), and a digital signal processor (DSP). For example, the core 108 is a processing unit that reads and executes instructions (e.g., of a program), examples of which include to add, to move data, and to branch. Although one core 108 is depicted in the illustrated example, in variations, the host 102 includes more than one core 108 (e.g., the host 102 is a multi-core processor).

In one or more implementations, the memory module 104 is a circuit board (e.g., a printed circuit board), on which the memory 110 is mounted and includes the processing-in-memory component 112. In some variations, one or more integrated circuits of the memory 110 are mounted on the circuit board of the memory module 104, and the memory module 104 includes one or more processing-in-memory components 112. Examples of the memory module 104 include, but are not limited to, a TransFlash memory module, a single in-line memory module (SIMM), and a dual in-line memory module (DIMM). In one or more implementations, the memory module 104 is a single integrated circuit device that incorporates the memory 110 and the processingin-memory component 112 on a single chip. In some examples, the memory module 104 is composed of multiple chips that implement the memory 110 and the processing-in-memory component 112 that are vertically ("3D") stacked together, are placed side-by-side on an interposer or substrate, or are assembled via a combination of vertical stacking or side-by-side placement.

The memory 110 is a device or system that is used to store information, such as for immediate use in a device (e.g., by the core 108 of the host 102 and/or by the processing-in-memory component 112). In one or more implementations, the memory 110 corresponds to semiconductor memory where data is stored within memory cells on one or more integrated circuits. In at least one example, the memory 110 corresponds to or includes volatile memory, examples of which include random-access memory (RAM), dynamic random-access memory (DRAM), synchronous dynamic random-access memory (SDRAM), and static random-access memory (SRAM).

In some implementations, the memory 110 corresponds to or includes a cache memory of the core 108 and/or the host 102 such as a level 1 cache, a level 2 cache, a level 3 cache, and so forth. For example, the memory 110 represents high bandwidth memory (HBM) in a 3D-stacked implementation. Alternatively or additionally, the memory 110 corresponds to or includes non-volatile memory, examples of which include solid state disks (SSD), flash memory, read-only memory (ROM), programmable read-only memory (PROM), erasable programmable read-only memory (EPROM), and electronically erasable programmable read-only memory (EEPROM). The memory 110 is thus configurable in a variety of ways that support memory verification (e.g., of the memory 110) using processing-in-memory without departing from the spirit or scope of the described techniques.

Broadly, the processing-in-memory component 112 is configured to process processing-in-memory instructions, e.g., received from the core 108 via the connection/interface 106. The processing-in-memory component 112 is representative of a processor with example processing capabilities ranging from relatively simple (e.g., an adding machine) to relatively complex (e.g., a CPU/GPU compute core). In an example, the processing-in-memory component 112 processes the instructions using data stored in the memory 110.

Processing-in-memory contrasts with standard computer architectures which obtain data from memory, communicate the data to a remote processing unit (e.g., the core 108 of the host 102), and process the data using the remote processing unit (e.g., using the core 108 of the host 102 rather than the processing-in-memory component 112). In various scenarios, the data produced by the remote processing unit as a result of processing the obtained data is written back to memory, which involves communicating the produced data over the connection/interface 106 from the remote processing unit to memory. In terms of data communication pathways, the remote processing unit (e.g., the core 108 of the host 102) is further away from the memory 110 than the processing-in-memory component 112, both physically and topologically. As a result, conventional computer architectures suffer from increased data transfer latency, reduced data communication bandwidth, and increased data communication energy, particularly when the volume of data transferred between the memory and the remote processing unit is large, which can also decrease overall computer performance.

Thus, the processing-in-memory component 112 enables increased computer performance while reducing data transfer energy as compared to standard computer architectures that implement remote processing hardware. Further, the processing-in-memory component 112 alleviates memory performance and energy bottlenecks by moving one or more memory-intensive computations closer to the memory 110. Although the processing-in-memory component 112 is illustrated as being disposed within the memory module 104, in some examples, the described benefits of memory verification using processing-in-memory are realizable through near-memory processing implementations in which the processing-in-memory component 112 is disposed in closer proximity to the memory 110 (e.g., in terms of data communication pathways) than the core 108 of the host 102.

The processing-in-memory component 112 is illustrated as receiving sparse matrix processing logic 114, which represents instructions that are executable by the processing-in-memory component 112 to cause the processing-in-memory component 112 to perform sparse matrix operations using data stored in the memory 110. In accordance with the described techniques, execution of the sparse matrix processing logic 114 causes the processing-in-memory component 112 to access a vector stored at a first location in memory 110. In some implementations, the first location in memory 110 is a virtual memory location identified by a base virtual address for a corresponding hierarchical component of memory 110 (e.g., a base virtual address for a DRAM channel) in which the processing-in-memory component 112 is implemented. Execution of the sparse matrix processing logic 114 further causes the processing-in-memory component 112 to access a representation of a sparse matrix stored in a second location in the memory 110. In some implementations, the second location in memory 110 represents a physical memory location (e.g., a DRAM array). In response to accessing the representation of the sparse matrix, the processing-in-memory component 112 is configured to store at least a portion of the sparse matrix representation locally (e.g., in one or more registers of the processing-in-memory component 112).

In implementations, the representation of the sparse matrix is configured using a CSR or a CSC matrix representation format, an example of which is described in further detail below with respect to FIG. 2. Specifically, in an example implementation where the sparse matrix representation is stored in memory 110 using CSR, execution of the sparse matrix processing logic 114 causes the processing-in-memory component 112 to identify a column index value for a non-zero element of the sparse matrix to be used in performing a sparse matrix operation (e.g., to be used in computing a SpMV product). In such an implementation, the column index value is an integer ranging from zero to M, inclusive, where a number of columns included in the sparse matrix is defined as M−1. In this implementation, the vector stored at the first location in memory 110 is a vector comprising M elements, such that the column index value indicates a corresponding position of one of the elements in the vector stored at the first location in memory 110.

As another example, in an implementation where the sparse matrix representation is stored in memory 110 using CSC, execution of the sparse matrix processing logic 114 causes the processing-in-memory component 112 to identify a row index value for a non-zero element of the sparse matrix. In such an implementation the row index value is an integer ranging from zero to N, inclusive, where a number of rows included in the sparse matrix is defined as N−1. In such an implementation, the vector stored at the first location in memory 110 is a vector comprising N elements, such that the row index value indicates a corresponding position of one of the elements in the vector stored at the first location in memory 110. In the following description, execution of the sparse matrix processing logic 114 is described in the context of an implementation where the sparse matrix is stored in memory 110 using a CSR format.

Using the index value (e.g., the column index value for a non-zero element of a sparse matrix stored using a CSR format), the processing-in-memory component 112 is configured to identify a corresponding element in the vector stored at the first location in memory 110. In implementations where elements of the vector stored at the first location in memory 110 are stored contiguously, the processing-in-memory component 112 is configured to identify the corresponding element in the vector by computing an offset virtual address. The processing-in-memory component 112 computes the offset virtual address by incrementing a base virtual address for the vector stored at the first location in memory 110 using an offset identified by the index value (e.g., incrementing the base virtual address by an integer specified by the column index value for the non-zero element of the sparse matrix).

In implementations, the processing-in-memory component 112 is configured to identify the element in the vector stored at the first location in memory 110 using one or more indirect PIM commands for performing indirect addressing as described in 210133-US-NP., the disclosure of which is hereby incorporated by reference in its entirety. In this manner, the processing-in-memory component 112 is configured to execute the sparse matrix processing logic 114 to retrieve target data (e.g., the element in the vector) by determining a virtual address for the target data based on a physical memory address (e.g., the index value for a non-zero element in a sparse matrix, as defined by the sparse matrix representation stored in physical memory). In some implementations, executing the sparse matrix processing logic 114 causes the processing-in-memory component 112 to output the identified vector element as result 116.

Alternatively or additionally, executing the sparse matrix processing logic 114 further causes the processing-in-memory component 112 to perform a matrix operation using the identified element from the vector stored at the first location in memory 110 and a corresponding non-zero entry from a sparse matrix representation stored at the second location in memory 110. In an example implantation, the sparse matrix operation is performed as part of a SpMV algorithm and includes computing a product of the identified vector element and the non-zero entry from the sparse matrix representation. The product of the identified vector element and the non-zero entry from the sparse matrix representation is computed as a result vector element. In some implementations, the product of the identified vector element and the non-zero sparse matrix entry is by the processing-in-memory component 112 output as result 116.

Instructions included in the sparse matrix processing logic 114 for outputting the result 116 are configurable in a variety of manners. For instance, in some implementations the sparse matrix processing logic 114 includes an instruction that causes the processing-in-memory component 112 to communicate the result 116 to the host 102 (e.g., via the interface 106). Alternatively or additionally, in some implementations the sparse matrix processing logic 114 includes an instruction that causes the processing-in-memory component 112 to output the result 116 to a storage location in memory 110 (e.g., for subsequent access and/or retrieval by the host 102). Alternatively or additionally, in some implementations the sparse matrix processing logic 114 includes an instruction that causes the processing-in-memory component 112 to store the result 116 locally (e.g., in a register of the processing-in-memory component 112). In an implementation where the sparse matrix processing logic 114 previously caused the processing-in-memory component 112 to store at least a portion of a sparse matrix representation in a register of the processing-in-memory component 112, executing the sparse matrix processing logic 114 causes the processing-in-memory component 112 to output the result 116 to the register of the processing-in-memory component 112 by overwriting the previously stored data.

In one example, the processing-in-memory component 112 receives the sparse matrix processing logic 114 from the host 102 and/or the core 108 (e.g., via the interface 106). Alternatively or additionally, the processing-in-memory component 112 receives (e.g., loads) the sparse matrix processing logic 114 from a dedicated portion of the memory 110 (e.g., an externally non-addressable memory of a bank of the memory 110). Alternatively or additionally, the processing-in-memory component 112 receives (e.g., loads) the sparse matrix processing logic 114 from a defined location within the system 100 (e.g., independent of creating traffic to/from the memory module 104).

In some implementations, the sparse matrix processing logic 114 is received by the processing-in-memory component 112 as part of a command from the host 102 (e.g., as part of a command transmitted to the memory module 104 from the host 102). The processing-in-memory component 112 is thus configured to perform the sparse matrix operations described herein responsive to an instruction by the host 102. Alternatively or additionally, the processing-in-memory component 112 is configured to execute instructions set forth in the sparse matrix processing logic 114 independent of receiving a command or instruction from the host 102. For instance, in an example implementation the processing-in-memory component 112 is configured to store the sparse matrix processing logic 114 locally (e.g., in one or more registers of the processing-in-memory component 112). In such an implementation, the sparse matrix processing logic 114 causes the processing-in-memory component 112 to monitor one or more defined locations in memory 110 (e.g., a defined memory address range, non-contiguous storage locations in memory 110, or a combination thereof) and execute instructions set forth in the sparse matrix processing logic 114 in response to a data write operation to the one or more defined locations in memory 110 (e.g., in response to a sparse matrix being written to a defined physical memory location).

Because the processing-in-memory component 112 executes the sparse matrix processing logic 114 to perform sparse matrix operations using data stored in memory 110, the processing-in-memory component 112 performs the described techniques with minimal impact on the system 100 (e.g., without invalidating caches of the system 100 or causing traffic on the connection/interface 106). For instance, the processing-in-memory component 112 performs sparse matrix operations on data stored in the memory 110 "in the background" with respect to the host 102 and the core 108, which frees up cycles of the host 102 and/or the core 108, reduces memory bus traffic (e.g., reduces traffic on the connection/interface 106), and reduces power consumption relative to performing operations at the host 102 and/or the core 108. Notably, because the processing-in-memory component 112 is closer to the memory 110 than the core 108 of the host 102 in terms of data communication pathways, performing sparse matrix operations using data stored in memory 110 is generally completed in a shorter amount of time using the processing-in-memory component 112 than if the same sparse matrix operations were performed using the same data at the core 108 of the host 102.

Figure 2:
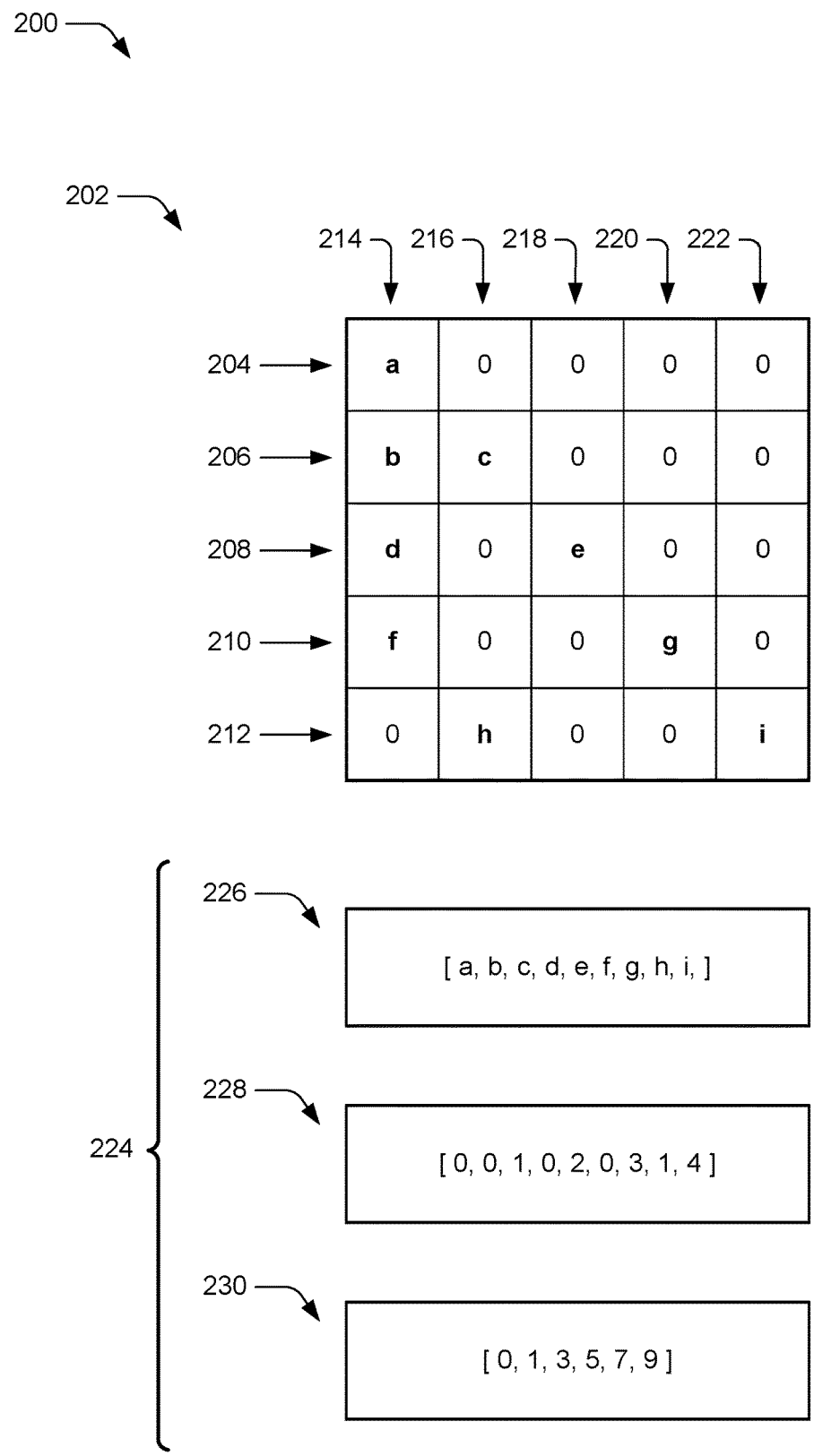
FIG. 2 depicts an example of a sparse matrix and a representation of the sparse matrix.
Figure 3:
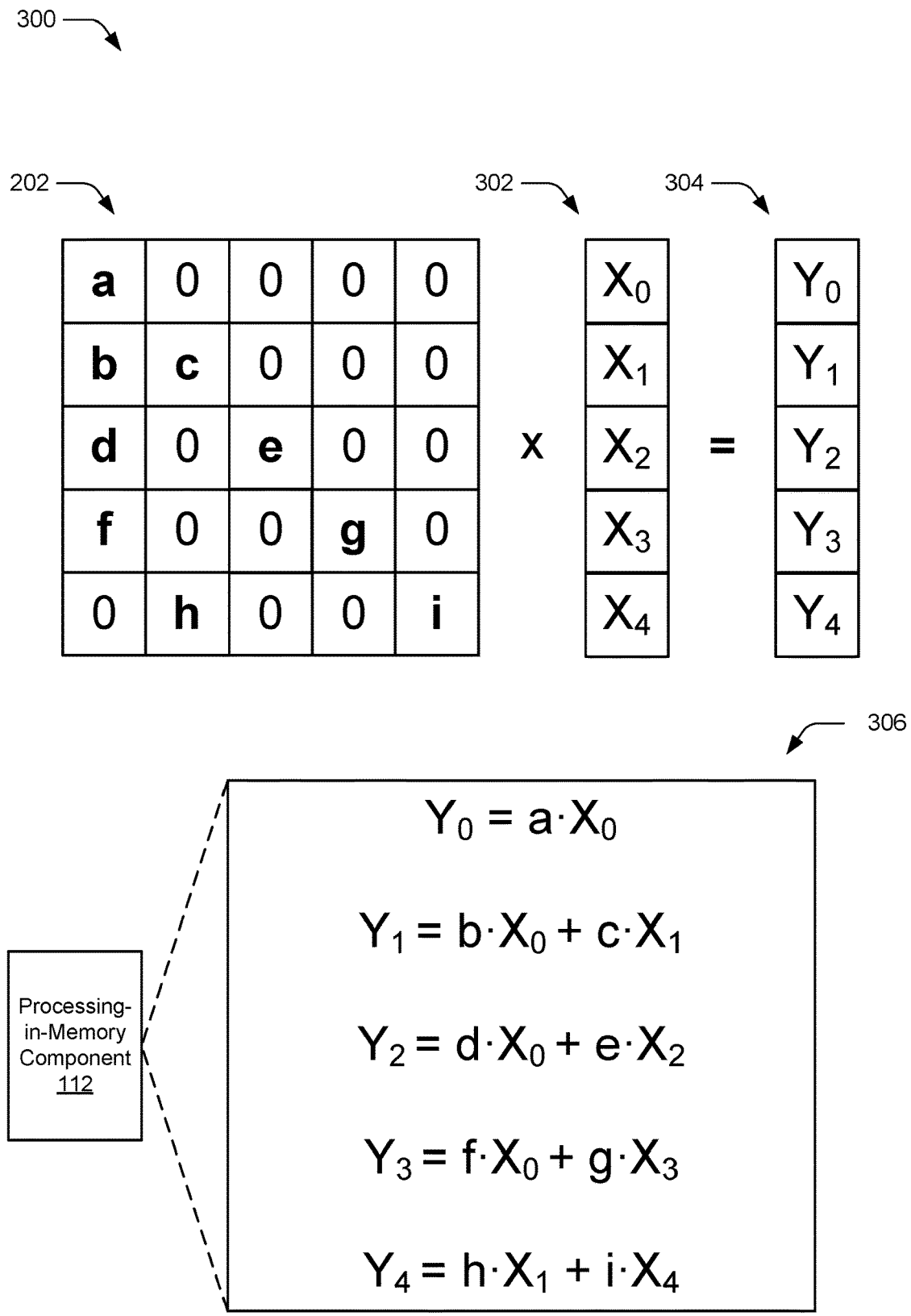
FIG. 3 depicts an example of sparse matrix operations performed by a processing-in-memory component using the example sparse matrix of FIG. 2 when executing the sparse matrix processing logic.

For a detailed description of a sparse matrix representation stored in memory 110 and example operations performed by the processing-in-memory component 112 when executing the sparse matrix processing logic 114, consider FIGS. 2 and 3.

FIG. 2 depicts an example 200 of a sparse matrix and a representation of the sparse matrix in a CSR format.

The example 200 is depicted as including a sparse matrix 202. The sparse matrix 202 is depicted as including five rows: row 204, row 206, row 208, row 210, and row 212. The sparse matrix 202 is further depicted as including five columns: column 214, column 216, column 218, column 220, and column 222. With five rows and five columns, the sparse matrix 202 includes 25 different elements in total. Although described herein with respect to a 5×5 sparse matrix for purposes of simplicity, the described techniques are not so limited and should be understood to extend to sparse matrices of significantly larger sizes. Among the 25 elements in the sparse matrix 202, there are nine non-zero elements, represented as a, b, c, d, e, f, g, h, and i.

The example 200 is further depicted as including a representation 224 of the sparse matrix 202. The representation 224 is formatted as a CSR format, also known as a compressed row storage format or Yale format, of the sparse matrix 202. The representation 224 represents the sparse matrix 202 using a plurality of one-dimensional arrays that respectively include non-zero values of the sparse matrix 202, column indices for the non-zero values, and extents of non-zero values included in respective rows of the sparse matrix 202. For instance, representation 224 includes a value array 226 that contains the non-zero values of the sparse matrix 202 (e.g., a, b, c, d, e, f, g, h, and i).

The representation 224 further includes a column index array 228, which contains column indices for the non-zero values of the sparse matrix 202. For instance, each column of the sparse matrix 202 is assigned an integer value, with a leftmost column of the sparse matrix 202 being assigned an index value of zero. With respect to the illustrated example 200, column 214 has an index value of zero, column 216 has an index value of one, column 218 has an index value of two, column 220 has an index value of three, and column 222 has an index value of four. In this manner, the ordering of column index values set forth in the column index array 228 identifies a corresponding column of the sparse matrix 202 in which a non-zero value of the value array 226 is located. For instance, values a, b, d, and f are each associated with a column index value of zero, values c and h are each associated with a column index value of one, value e is associated with a column index value of two, value g is associated with a column index value of three, and value i is associated with a column index value of four.

The representation 224 further includes a row index array 230, including a sequence of index pointers that indicate how many non-zero values are included in respective rows of the sparse matrix 202. Adjacent pairs of values in the row index array are useable to define how many non-zero values are included in a given row of the sparse matrix 202. A position of a value pair in the row index array 230 identifies a corresponding row number in the sparse matrix 202 and a difference between values of the value pair describe how many non-zero values exist in the identified row. For instance, the row index array 230 includes five value pairs, one for each row in the sparse matrix 202. As a specific example, value pair (0, 1) is positioned first in the row index array 230, indicating that the value pair corresponds to row 204 and has a difference identifying that only one non-zero value exists in row 204 (e.g., value "a"). As another specific example, value pair (5, 7) is positioned fourth in the row index array 230, indicating that the value pair corresponds to row 210 and has a difference identifying that two non-zero values exist in row 210 (e.g., values "f" and "g").

FIG. 3 depicts an example 300 of sparse matrix operations performed by the processing-in-memory component 112 using the example sparse matrix of FIG. 2 when executing the sparse matrix processing logic 114. Specifically, the illustrated example 300 depicts an implementation where the processing-in-memory component 112 executes the sparse matrix processing logic 114 to perform SpMV using the sparse matrix 202 of FIG. 2.

In the illustrated example 300, the processing-in-memory component 112 is depicted as performing SpMV using the sparse matrix 202 and a dense vector 302 as part of generating a result vector 304. The dense vector 302 is representative of a one-dimensional array of values stored in virtual memory (e.g., stored at a base virtual address issued to a hierarchical component of memory 110 (e.g., a DRAM channel) in which the processing-in-memory component 112 is implemented. The dense vector 302 includes a plurality of elements, one for each column of the sparse matrix 202. Specifically, dense vector 302 is depicted as including elements $X_0$, $X_1$, $X_2$, $X_3$, and $X_4$.

Result vector 304 includes a same number of elements as dense vector 302, depicted as elements $Y_0$, $Y_1$, $Y_2$, $Y_3$, and $Y_4$. In computing elements of the result vector 304 using SpMV, each non-zero value of the sparse matrix 202 is multiplied with a corresponding one of the elements included in the dense vector 302, where a column index for the non-zero element (e.g., as specified by column index array 228) indicates a position of the corresponding one of the elements included in the dense vector 302. The resulting products generated from multiplying non-zero elements of a given row in the sparse matrix 202 are then summed to achieve an element in the result vector 304.

The illustrated example 300 depicts a plurality of operations 306 that are performed as part of computing individual elements of the result vector 304. For instance, element $Y_0$ corresponds to a first position in a sequence of elements of the result vector 304, and is thus computed using non-zero values from a first row of the sparse matrix 202 (e.g., using non-zero elements included in row 204). Non-zero elements from row 204 are individually multiplied by corresponding values in the dense vector 302 and the resulting products are summed. In a similar manner, element $Y_1$ is computed by summing the products of non-zero elements from row 206 multiplied by values in the dense vector 302, where respective values in the dense vector 302 are identified using the column index array 228.

Specifically, operations 306 demonstrate how $Y_0$ is computed as the product of value "a" in the sparse matrix 202 with element $X_0$ in the dense vector 302. Operations 306 further demonstrate how $Y_1$ is computed as the sum of the product of value "b" in the sparse matrix 202 with element $X_0$ in the dense vector 302 and the product of value "c" with element $X_1$. Operations 306 further demonstrate how $Y_2$ is computed as the sum of the product of value "d" with element X0 and the product of value "e" with element $X_2$. Operations 306 further demonstrate how $Y_3$ is computed as the sum of the product of value "f" with element $X_0$ and the product of value "g" with element $X_3$. Operations 306 further demonstrate how $Y_4$ is computed as the sum of the product of value "h" with element $X_1$ and the product of value "i" with element $X_4$.

In implementations, the processing-in-memory component 112 is configured to execute the sparse matrix processing logic 114 to compute any one or more of the products that define one or more of the elements in the result vector 304 and output a result of the computation as result 116. For instance, in an example implementation the processing-in-memory component 112 is configured to compute a single product (e.g., $d \cdot X_0$) and output the resulting single product as the result 116. In other implementations, the processing-in-memory component 112 is configured to compute multiple products, such as products involving non-zero entries for one or more rows of the sparse matrix 202 or one or more columns of the sparse matrix 202, and output the computed products as result 116. In implementations where the processing-in-memory component 112 computes multiple products as part of computing the result vector 304, result 116 is generated to specify unsummed results of the multiple products. For instance, in an implementation where the processing-in-memory component 112 is tasked with computing SpMV products for non-zero elements in row 208 of the sparse matrix 202, the result 116 is generated to specify the respective products of $d \cdot X_0$ and $e \cdot X_2$, without summing the respective products. Alternatively, the processing-in-memory component 112 is configured to sum the results of multiple products, such that in the implementation where the processing-in-memory component 112 is tasked with computing SpMV products for non-zero elements in row 208 of the sparse matrix 202, result 116 includes a single value for $Y_2$.

Having considered example details of performing sparse matrix operations using compressed sparse matrix representations, consider an example of using processing-in-memory to perform sparse matrix operations.

Figure 4:
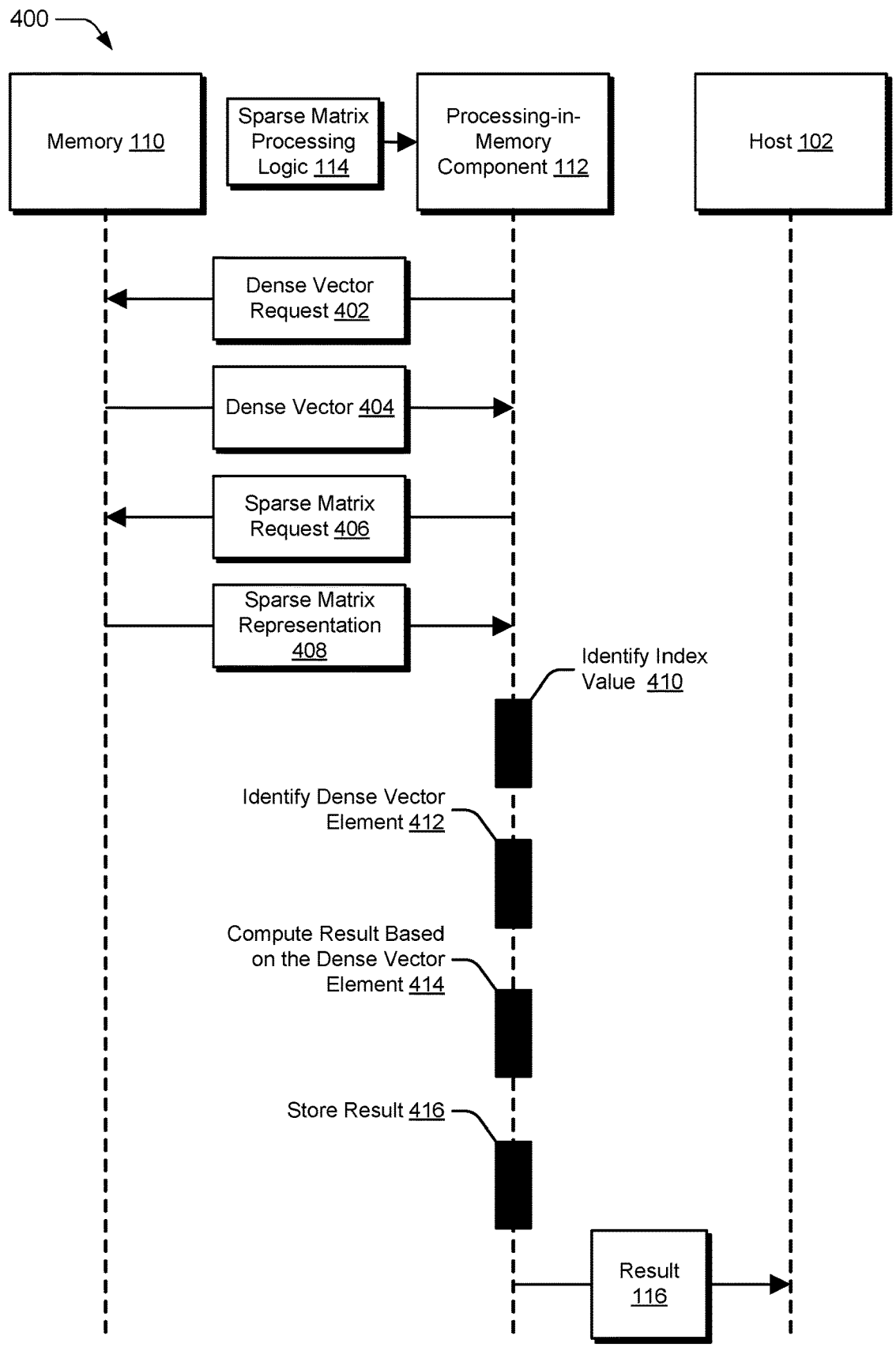
FIG. 4 depicts an example of using processing-in-memory to perform sparse matrix operations.

FIG. 4 depicts an example 400 of using processing-in-memory to perform sparse matrix operations.

The example 400 is depicted as including the host 102, the memory 110, and the processing-in-memory component 112. The processing-in-memory component 112 is depicted as receiving (e.g., loading) and executing instructions included in the sparse matrix processing logic 114, which cause the processing-in-memory component 112 to perform one or more operations using data for a sparse matrix stored in memory 110. Example locations in memory 110 include a bank of the memory 110, a cell of the memory 110, a block of the memory 110, and so forth. In accordance with the techniques described herein, the sparse matrix processing logic 114 advantageously enable the processing-in-memory component 112 to perform sparse matrix operations using first data stored in virtual memory and second data stored in physical memory. In executing the instructions set forth in the sparse matrix processing logic 114, the processing-in-memory component 112 is configured to retrieve a dense vector from memory 110 via a dense vector request 402. The dense vector request 402 is representative of a request for a vector stored at a base virtual address for a copy of a dense vector assigned to a hierarchical component of memory 110 (e.g., a base virtual address for a DRAM channel) in which the processing-in-memory component 112 is implemented. In implementations, the base virtual address for the memory location from which the dense vector is requested is defined by the sparse matrix processing logic 114.

The processing-in-memory component 112 is configured to access the dense vector 404 from the base virtual address in memory 110. For instance, the processing-in-memory component 112 accesses the dense vector 302 from a base virtual address specified by the sparse matrix processing logic 114. In some implementations, the processing-in-memory component 112 stores the dense vector 404 in one or more registers of the processing-in-memory component 112. Alternatively, in some implementations the processing-in-memory component 112 accesses data included in the dense vector 404 from virtual memory without storing one or more elements of the dense vector 404 in a register of the processing-in-memory component 112. In executing the instructions set forth in the sparse matrix processing logic 114, the processing-in-memory component 112 is further configured to retrieve at least a portion of a sparse matrix representation from memory 110 via a sparse matrix request 406. The sparse matrix request 406 is representative of a request for a portion or an entirety of a sparse matrix representation stored at one or more physical memory locations in memory 110.

The processing-in-memory component 112 is configured to access at least a portion of a sparse matrix representation 408 from memory 110 in response to the sparse matrix request 406. In some implementations, the portion of the sparse matrix representation retrieved as part of the sparse matrix representation 408 includes a value array and a column index array for a sparse matrix representation formatted using CSR. For instance, the sparse matrix representation 408 is representative of the value array 226 and the column index array 228 of the representation 224 for sparse matrix 202. In some implementations, the processing-in-memory component 112 is configured to store at least a portion of the sparse matrix representation 408 locally, such as in one or more registers of the processing-in-memory component 112. For instance, the processing-in-memory component 112 stores the at least one non-zero value of a sparse matrix in one or more registers. In this manner, one or more sparse matrix non-zero values are readily accessible for subsequent processing when computing one or more sparse matrix operations.

In executing the instructions set forth in the sparse matrix processing logic 114, the processing-in-memory component 112 is further configured to identify an index value 410 for at least one non-zero element included in the sparse matrix representation 408. The processing-in-memory component 112, for instance, identifies an index value set forth in the column index array 228 for a non-zero element included in the value array 226. Based on the identified index value for a non-zero element in the sparse matrix representation 408, the processing-in-memory component 112 identifies a dense vector element 412 in the dense vector 404. The processing-in-memory component 112, for instance, identifies an integer value specified by the identified index value and computes an offset virtual address by incrementing the base virtual address of the dense vector 404 using the integer value.

The processing-in-memory component 112 then uses the offset virtual address to retrieve an element from the dense vector 404 stored at the offset virtual address. In some implementations, although the dense vector request 402 and accessing the dense vector 404 are depicted in FIG. 4 as occurring above the block representing where the processing-in-memory component 112 identifies the dense vector element 412, in some implementations the dense vector request 402 is not communicated until after the processing-in-memory component 112 identifies the dense vector element 412. For instance, in some implementations, after identifying the dense vector element 412, the processing-in-memory component 112 communicates a dense vector request 402 to the offset virtual address and retrieves only the element stored at the offset virtual address as the dense vector 404. In this manner, the processing-in-memory component 112 is configured to request no more of the dense vector 404 than is needed to perform the sparse matrix operation with which the processing-in-memory component 112 is tasked (e.g., retrieve a single dense vector element for a single non-zero value in the sparse matrix representation 408).

In some implementations, the processing-in-memory component 112 is configured to store the identified dense vector element locally, such as in one or more registers of the processing-in-memory component 112. The processing-in-memory component 112 is configured to perform the steps of identifying an index value 410 and identifying a dense vector element 412 for each non-zero element in the sparse matrix representation 408 that the processing-in-memory component 112 is tasked with processing. In some implementations, executing the sparse matrix processing logic 114 further causes the processing-in-memory component 112 to perform masking on the identified dense vector element, based on a data type of the dense vector element. For instance, in an example implementation where the non-zero value of the sparse matrix representation and the corresponding dense vector element are stored as floating-point numbers, the processing-in-memory component 112 performs masking to remove a plurality of upper bits so that data stored in one or more registers of the processing-in-memory component 112 (e.g., the non-zero value and the dense vector element) are represented as single precision values.

In executing the sparse matrix processing logic 114, the processing-in-memory component 112 is further configured to compute a result 116 based on the dense vector element 414. The processing-in-memory component 112, for instance, computes a result vector element by multiplying the non-zero element in the sparse matrix representation 408 and the identified dense vector element as part of executing an SpMV algorithm. In some implementations, the processing-in-memory component 112 is configured to store a result 416 of the result 116 computed using the dense vector element and the non-zero sparse matrix element. The processing-in-memory component 112, for instance, stores the result 116 locally, such as in one or more registers of the processing-in-memory component 112. In some implementations, storing the result 416 is performed by overwriting data previously stored in the one or more registers of the processing-in-memory component 112. For instance, the processing-in-memory component 112 overwrites at least one sparse matrix non-zero value and/or at least one identified dense vector element previously written to one or more registers of the processing-in-memory component 112. Alternatively, in some implementations the processing-in-memory component 112 stores the result 116 locally without overwriting data previously written to one or more registers of the processing-in-memory component 112.

Alternatively or additionally, the processing-in-memory component 112 is configured to store the result 416 by writing the result 116 to a storage location of memory 110. Alternatively or additionally, in some implementations the processing-in-memory component 112 is configured to output the result 116 to the host 102. For instance, the processing-in-memory component 112 communicates the result 116 to the host 102 via the interface 106. For instance, in an example implementation the processing-in-memory component 112 communicates the result 116 as individual result vector elements to the host 102 for further processing. As a specific example, the processing-in-memory component 112 communicates the result 116 as indicating the respective products of $d \cdot X_0$ and $e \cdot X_2$, unsummed, such that the host 102 is able to perform the summation to compute the final value of $Y_2$ for the result vector 304.

Figure 5:
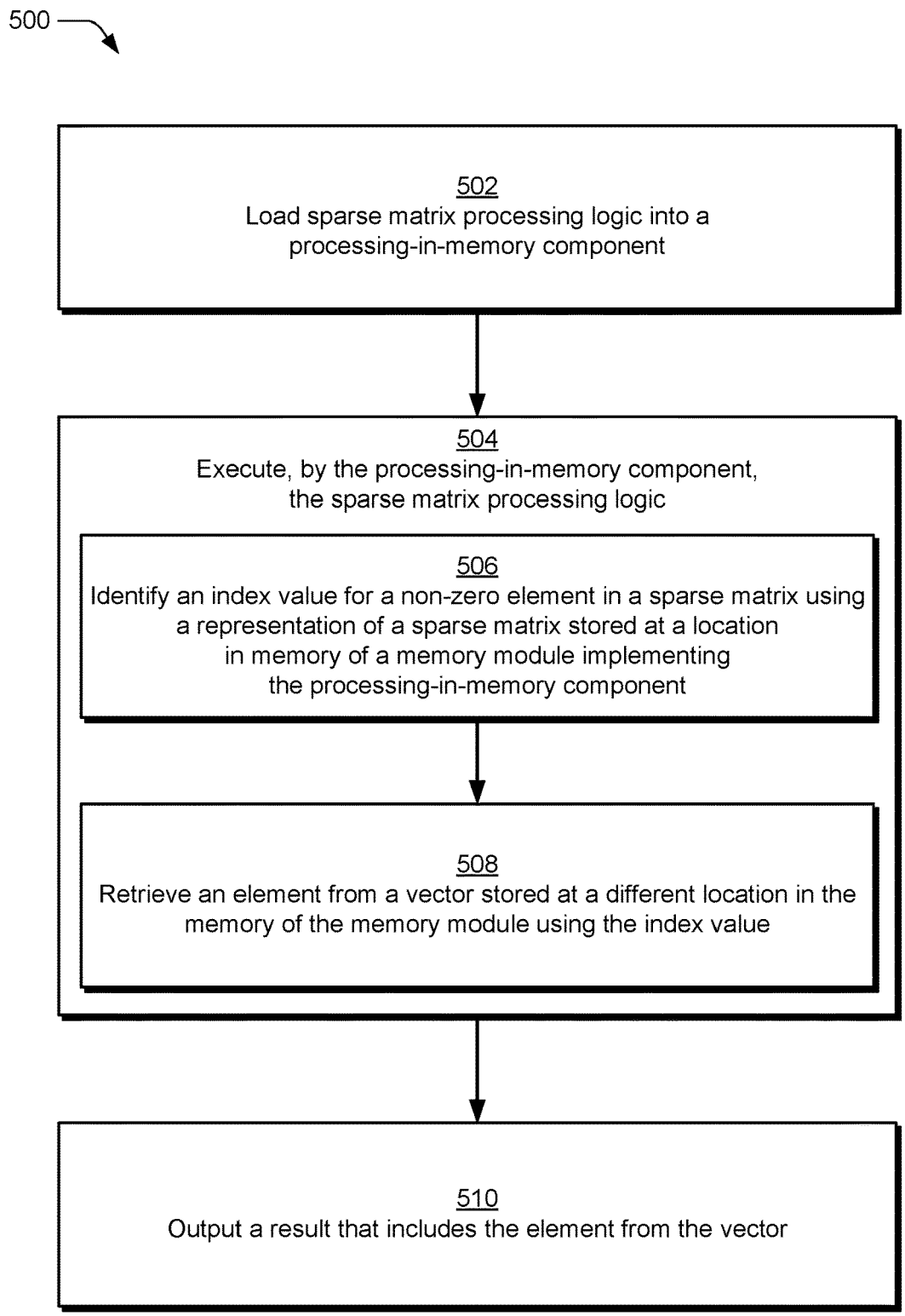
FIG. 5 depicts a procedure in an example implementation of performing sparse matrix operations using processing-in-memory.

FIG. 5 depicts a procedure 500 in an example implementation of performing sparse matrix operations using processing-in-memory.

Sparse matrix processing logic is loaded into a processing-in-memory component (block 502). For instance, sparse matrix processing logic 114 is loaded into processing-in-memory component 112 from the host 102, from a dedicated portion of the memory 110, from another location within the memory 110, combinations thereof, and so forth. As an example, the sparse matrix processing logic 114 is loaded into the processing-in-memory component 112 at the instruction of an application kernel executing on the host 102. As another example, the sparse matrix processing logic 114 is loaded into the processing-in-memory component 112 upon an initialization of the system 100 (e.g., during boot of the system 100).

The sparse matrix processing logic is executed by the processing-in-memory component (block 504). As part of executing the sparse matrix processing logic, an index value for a non-zero element in a sparse matrix is identified using a representation of a sparse matrix stored at a location in memory of a memory module implementing the processing-in-memory component (block 506). The processing-in-memory component 112, for instance, accesses a sparse matrix representation 408 from physical memory in memory 110 and identifies a non-zero value included in the sparse matrix. As a specific example, the processing-in-memory component 112 identifies a non-zero element included in the value array 226 for the representation 224 of sparse matrix 202. The processing-in-memory component 112 then identifies an index value for the non-zero element in the sparse matrix representation 408. Continuing the specific example, the processing-in-memory component 112 identifies an index value from the column index array 228 of the representation 224 for sparse matrix 202.

As further part of executing the sparse matrix processing logic, an element from a vector stored at a different location in the memory of the memory module is retrieved using the index value (block 508). The processing-in-memory component 112, for instance, identifies a base virtual address of a dense vector stored in virtual memory from the sparse matrix processing logic 114. The processing-in-memory component 112 then computes an offset virtual address by incrementing the base virtual address by an integer value defined by the index value. The processing-in-memory component 112 retrieves a dense vector element stored at the offset virtual address using a dense vector request 402.

A result that includes the element from the vector is then output (block 510). The processing-in-memory component 112, for instance, outputs the retrieved dense vector element as result 116. Alternatively or additionally, the processing-in-memory component 112 further processes the retrieved dense vector element using one or more sparse matrix operations. For instance, the processing-in-memory component 112 computes a result vector element by multiplying the dense vector element by the non-zero element in the sparse matrix corresponding to the index value that was used to retrieve the vector element and outputs the result vector element as the result 116. In some implementations, the processing-in-memory component 112 outputs the result 116 to the host 102. Alternatively or additionally, the processing-in-memory component 112 stores the result 116 for subsequent access by the host 102, such as in one or more storage locations of memory 110, locally in one or more registers of the processing-in-memory component 112, or combinations thereof.

Figure 6:
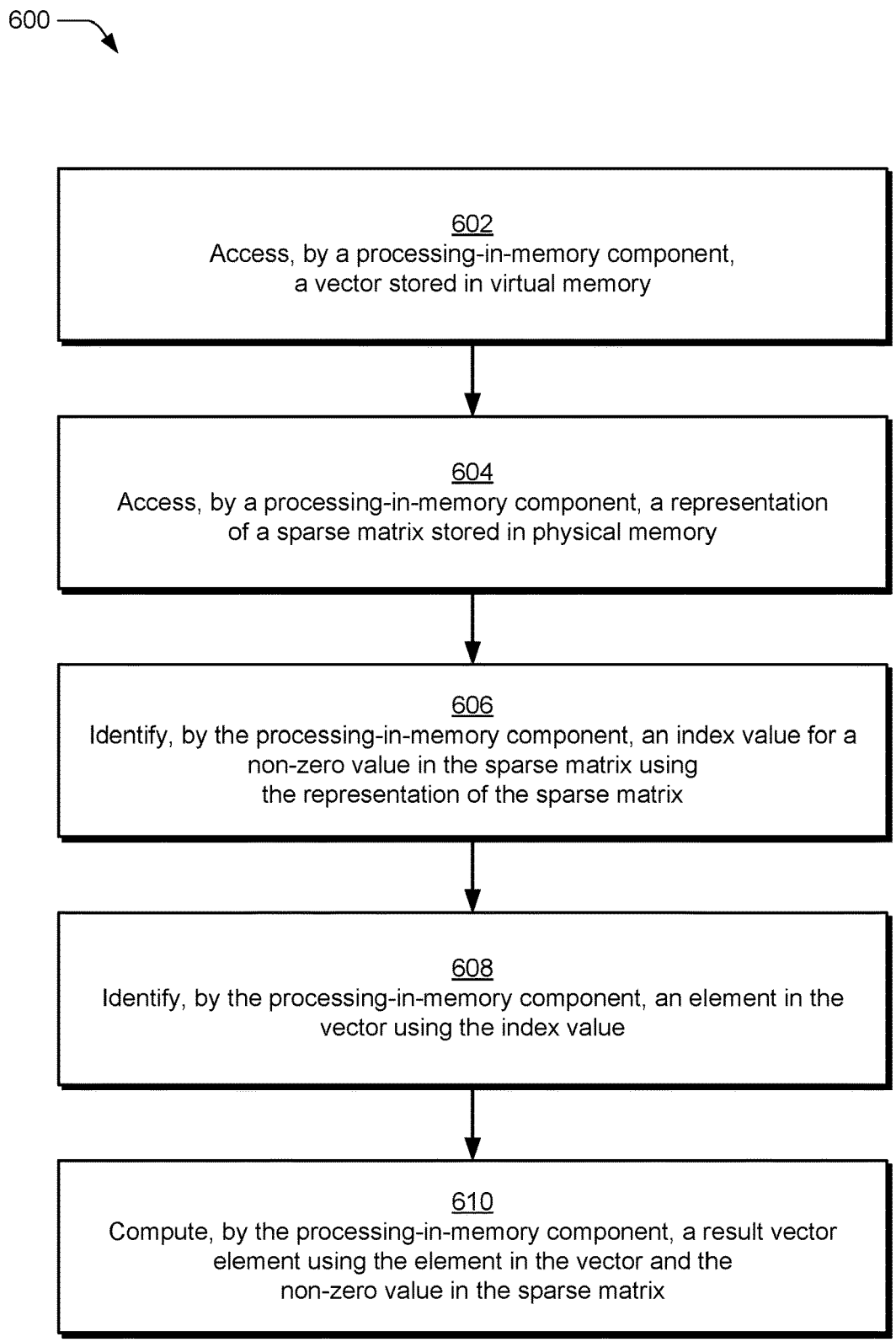
FIG. 6 depicts a procedure in an example implementation of performing sparse matrix operations using processing-in-memory.

FIG. 6 depicts a procedure 600 in an example implementation of performing sparse matrix operations using processing-in-memory.

A vector stored in virtual memory is accessed by a processing-in-memory component (block 602). The processing-in-memory component 112, for instance, transmits a dense vector request 402 to memory 110 and retrieves a dense vector 404 from a base virtual address in memory 110. In implementations, the base virtual address for the dense vector 404 is specified by sparse matrix processing logic 114 executed by the processing-in-memory component 112.

A representation of a sparse matrix stored in physical memory is accessed by the processing-in-memory component (block 604). The processing-in-memory component 112, for instance, transmits a sparse matrix request 406 to memory 110 and retrieves a sparse matrix representation 408 from a physical memory location in memory 110. In implementations, the physical memory location for the sparse matrix representation 408 is specified by the sparse matrix processing logic 114 executed by the processing-in-memory component 112.

An index value for the non-zero value in the sparse matrix is identified by the processing-in-memory component using the representation of the sparse matrix (block 606). The processing-in-memory component 112, for instance, accesses a sparse matrix representation 408 from physical memory in memory 110 and identifies a non-zero value included in the sparse matrix. As a specific example, the processing-in-memory component 112 identifies a non-zero element included in the value array 226 for the representation 224 of sparse matrix 202. The processing-in-memory component 112 then identifies an index value for the non-zero element in the sparse matrix representation 408. Continuing the specific example, the processing-in-memory component 112 identifies an index value from the column index array 228 of the representation 224 for sparse matrix 202.

An element in the vector is then identified by the processing-in-memory component using the index value (block 608). The processing-in-memory component 112, for instance, identifies a base virtual address of a dense vector stored in virtual memory from the sparse matrix processing logic 114. The processing-in-memory component 112 then computes an offset virtual address by incrementing the base virtual address by an integer value defined by the index value. The processing-in-memory component 112 retrieves a dense vector element stored at the offset virtual address using a dense vector request 402.

A result vector element is then computed by the processing-in-memory component using the element in the vector and the non-zero value in the sparse matrix (block 610). For instance, the processing-in-memory component 112 computes a result vector element by multiplying the dense vector element by the non-zero element in the sparse matrix corresponding to the index value that was used to retrieve the vector element and outputs the result vector element as the result 116. In some implementations, the processing-in-memory component 112 outputs the result 116 to the host 102. Alternatively or additionally, the processing-in-memory component 112 stores the result 116 for subsequent access by the host 102, such as in one or more storage locations of memory 110, locally in one or more registers of the processing-in-memory component 112, or combinations thereof.

The example techniques described herein are merely illustrative and many variations are possible based on this disclosure. Although features and elements are described above in particular combinations, each feature or element is usable alone without the other features and elements or in various combinations with or without other features and elements.

The various functional units illustrated in the figures and/or described herein (including, where appropriate, the host 102 having the core 108 and the memory module 104 having the memory 110 and the processing-in-memory component 112) are implemented in any of a variety of different manners such as hardware circuitry, software or firmware executing on a programmable processor, or any combination of two or more of hardware, software, and firmware. The methods provided are implemented in any of a variety of devices, such as a general-purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general-purpose computer or a processor. Examples of non-transitory computer-readable storage mediums include a read only memory (ROM), a random-access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A system comprising:
a memory; and
an in-memory processor configured to:
   receive a request for at least one element of a vector stored at a location in the memory;
   identify, from a representation of a sparse matrix stored at a different location in the memory, at least one index value for at least one non-zero element in a row of the sparse matrix; and
   output, to a register of the in-memory processor, a result that includes the at least one element of the vector by retrieving the at least one element of the vector from the location in the memory using the at least one index value.

2. The system of claim 1, wherein the location in the memory corresponds to a virtual memory location identified by a base virtual address.

3. The system of claim 2, wherein the in-memory processor is configured to retrieve the at least one element of the vector from the location in the memory by:
   computing, for an index value of the identified at least one index value, an offset virtual address by incrementing the base virtual address using the index value; and
   accessing data stored at the offset virtual address.

4. The system of claim 1, wherein the in-memory processor is further configured to access the representation of the sparse matrix from the different location in the memory and store the representation of the sparse matrix in the register of the in-memory processor in response to receiving the request.

5. The system of claim 4, wherein the in-memory processor is configured to output the result by overwriting the representation of the sparse matrix in the register of the in-memory processor with the at least one element of the vector.

6. The system of claim 1, wherein the in-memory processor is further configured to compute a result vector element using the at least one element of the vector and the at least one non-zero element in the row of the sparse matrix.

7. The system of claim 1, wherein the in-memory processor is configured to receive the request for the at least one element of the vector from a host that includes a core.

8. The system of claim 7, wherein the in-memory processor is configured to output the result to the host.

9. The system of claim 1, wherein the memory comprises a plurality of in-memory processors, wherein the system is configured to load sparse matrix processing logic into each of the plurality of in-memory processors and task each of the plurality of in-memory processors with identifying, for a different row of the sparse matrix, one or more index values for one or more non-zero elements in the different row of the sparse matrix.

10. The system of claim 1, wherein the in-memory processor is configured to output the result by writing the result to a memory location that is communicatively coupled to a host that includes a core.

11. The system of claim 10, wherein the core is a central processing unit or a graphics processing unit.

12. The system of claim 1, wherein the in-memory processor is configured to identify the at least one index value and output the result by executing sparse matrix processing logic that is received from a host that includes a core.

13. The system of claim 1, wherein the request is received from a host that includes a core and the in-memory processor is configured to identify the at least one index value and output the result without traffic on a connection between the host and the memory.

14. The system of claim 1, wherein the at least one element of the vector is a floating-point number stored at the location in the memory and wherein the in-memory processor is further configured to identify a single precision bit in the floating-point number by removing a plurality of bits from the floating-point number, wherein the result is computed using the single precision bit and the at least one non-zero element in the row of the sparse matrix.

15. A method comprising:
  accessing, by an in-memory processor, a dense vector stored in virtual memory;
  accessing, by the in-memory processor, a representation of a sparse matrix stored in physical memory and identifying an index value for a non-zero value in the sparse matrix using the representation of the sparse matrix;
  identifying, by the in-memory processor, an element in the dense vector using the index value;
  computing, by the in-memory processor, a result vector element using the element in the dense vector and the non-zero value in the sparse matrix; and
  storing, by the in-memory processor, the result vector element in at least one register of the in-memory processor.

16. The method of claim 15, wherein identifying the element in the dense vector using the index value comprises computing an offset virtual address by incrementing a base virtual address for the dense vector using an offset identified by the index value.

17. The method of claim 15, further comprising:
  storing, by the in-memory processor, the representation of the sparse matrix in the at least one register of the in-memory processor in response to accessing the representation of the sparse matrix, wherein storing; and outputting, by the, the result vector element comprises overwriting the representation of the sparse matrix in the at least one register of the in-memory processor.

18. The method of claim 15, further comprising outputting, by the in-memory processor, the result vector element to a host that includes a core, wherein the host is communicatively coupled to a memory implementing the in-memory processor.

19. The method of claim 15, wherein accessing the dense vector, accessing the representation of the sparse matrix, identifying the element in the dense vector, and computing the result vector element are performed by the in-memory processor independent of traffic on a connection between a memory implementing the in-memory processor and a host that includes a core.

20. A method comprising:
  receiving, by an in-memory processor, a request for at least one element of a vector stored at a location in a memory of a device;
  identifying, by the in-memory processor and from a representation of a sparse matrix stored at a different location in the memory, at least one column index value for at least one non-zero element in a row of the sparse matrix;
  retrieving, by the in-memory processor, the at least one element of the vector from the location in the memory using the at least one column index value; and
  outputting, by the in-memory processor, a result that includes the at least one element of the vector by storing the result in a register of the in-memory processor.

* * * * *